(12) United States Patent
Van Der Heijden et al.

(10) Patent No.: US 7,992,115 B2
(45) Date of Patent: Aug. 2, 2011

(54) OVERLAY MEASUREMENT ON DOUBLE PATTERNING SUBSTRATE

(75) Inventors: Eddy Cornelis Antonius Van Der Heijden, Netersel (NL); Johannes Anna Quaedackers, Veldhoven (NL); Dorothea Maria Christina Oorschot, Eindhoven (NL); Hieronymus Johannus Christiaan Meessen, Eindhoven (NL); Yin Fong Choi, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 465 days.

(21) Appl. No.: 12/248,777

(22) Filed: Oct. 9, 2008

(65) Prior Publication Data

US 2009/0100391 A1   Apr. 16, 2009

Related U.S. Application Data

(60) Provisional application No. 60/960,698, filed on Oct. 10, 2007.

(51) Int. Cl.
*G06F 17/50* (2006.01)
(52) U.S. Cl. ........................................ 716/111
(58) Field of Classification Search .................... 716/111
See application file for complete search history.

(56) References Cited

U.S. PATENT DOCUMENTS

| | | | |
|---|---|---|---|
| 7,687,209 B2 | 3/2010 | Der Schaar et al. | |
| 2005/0195398 A1* | 9/2005 | Adel et al. | 356/401 |
| 2006/0039595 A1* | 2/2006 | Adel et al. | 382/144 |
| 2006/0204073 A1* | 9/2006 | Ghinovker et al. | 382/144 |
| 2007/0069398 A1* | 3/2007 | Smith et al. | 257/797 |
| 2008/0023855 A1* | 1/2008 | Ghinovker et al. | 257/797 |
| 2008/0049226 A1* | 2/2008 | Mieher et al. | 356/401 |
| 2009/0240466 A1* | 9/2009 | Mangan et al. | 702/158 |
| 2009/0291513 A1* | 11/2009 | Ghinovker et al. | 438/16 |
| 2009/0310113 A1* | 12/2009 | Musa et al. | 355/70 |
| 2011/0059407 A1* | 3/2011 | Lin et al. | 430/326 |

FOREIGN PATENT DOCUMENTS

| | | |
|---|---|---|
| JP | 10-213895 A | 8/1998 |
| JP | 11-133622 A | 5/1999 |
| JP | 2002-100557 A | 4/2002 |
| JP | 2004-356553 A | 12/2004 |
| JP | 2004-363313 A | 12/2004 |
| JP | 2007-258707 A | 10/2007 |

OTHER PUBLICATIONS

English language abstract of Japanese Patent Publication No. 10-213895 A, published Aug. 11, 1998; 1 page.
English language abstract of Japanese Patent Publication No. 11-133622 A, published May 21, 1999; 1 page.

(Continued)

*Primary Examiner* — Stacy Whitmore
*Assistant Examiner* — Magid Dimyan
(74) *Attorney, Agent, or Firm* — Sterne, Kessler, Goldstein & Fox P.L.L.C.

(57) ABSTRACT

A method of measuring overlay between a first structure and a second structure on a substrate is provided. The structures include equidistant elements, such as parallel lines, wherein the equidistant elements of the first and second structure alternate. A design width $CD_1$ of the elements of the first structure is different from a design width $CD_2$ of the elements of the second structure. The difference in design width can be used to identify measurement points having incorrectly measured overlay errors.

9 Claims, 4 Drawing Sheets

OTHER PUBLICATIONS

English language abstract of Japanese Patent Publication No. 2002-100557 A, published Apr. 5, 2002; 1 page.
English language abstract of Japanese Patent Publication No. 2004-356553 A, published Dec. 16, 2004; 1 page.
English language abstract of Japanese Patent Publication No. 2004-363313 A, published Dec. 14, 2004; 1 page.
English language abstract of Japanese Patent Publication No. 2007-258707 A, published Oct. 4, 2007; 1 page.
English translation of Japanese Notice of Reasons for Rejection directed to related Japanese Patent Application No. 2008-262675, Japanese Patent Office, mailed Mar. 7, 2011; 4 pages.

* cited by examiner

*State of the art*

OVERLAY MEASUREMENT ON DOUBLE PATTERNING SUBSTRATE

CROSS-REFERENCE TO RELATED APPLICATION

This application claims the benefit of the filing date of U.S. Provisional Application 60/960,698 filed on Oct. 10, 2007. The subject matter of that application is incorporated herein by reference as if fully set forth herein.

BACKGROUND OF THE INVENTION

1. Field of the Invention

The present invention relates to a method of measuring overlay on a substrate including two structures manufactured by way of a double patterning technique. It also relates to a method of manufacturing two structures on a substrate which can be used to measure overlay.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To improve the critical dimension (CD) of modern semiconductors, a technique called Double Patterning (DP) is used. In this technique two exposures are executed for one single layer on the substrate. For each exposure a specific mask is used that together with the other mask forms the desired pattern. Instead of Double Patterning, so-called Multiple Patterning is used wherein more than two exposures are used to form the desired pattern in a layer on a substrate.

Double patterning is used with critical dimensions of less than 100 nm. When forming a second structure next to a first structure in order to form a desired pattern, an overlay error may be present that is defined as the difference between the actual position of the second structure relative to the desired position of the second structure. The overlay error occurs due to alignment issues and/or optical errors in a lithographic apparatus. The overlay error will depend on the position on a substrate. In case of double patterning, the overlay error is referred to as Double Patterning Overlay error, i.e. DPTO error. To indicate that this error may vary as a function of the position on a substrate, below the term DPTO(x,y) is used.

So-called CDU wafers (CDU-critical dimension uniformity) are used to measure the DPTO(x,y) of a system. A CDU wafer is measured using for example a Scanning Electron Microscope (SEM) to obtain images of the CDU wafer at multiple points on the substrate. The CDU wafer may for example comprise a pattern of parallel lines that is formed by a double patterning technique, where elements (i.e. lines) of a first structure alternate with elements of a second structure. The first structure is formed using a first exposure and the second structure is formed at a second exposure. The images can be made around predetermined points $(x_i, y_i)$ on the substrate. The images are input for an image processor that is arranged to measure the DPTO for each image. To do this, the image processor needs to identify the first structure from the second structure. A possible solution is to instruct the SEM to scan areas around the predetermined points $(x_i, y_i)$ so that the predetermined points $(x_i, y_i)$ are positioned at a predefined position on each image (for example the exact centre of the image). Knowing that one of the lines of the first structure (or the second structure) is positioned at exactly position $(x_i, y_i)$, it can be concluded by the image processor that the line in the centre of the image is part of the first structure. This information is needed to calculate the correct DPTO(x,y). However, due limitations in the hard- and software of the metrology tool, the identification of structures might be unreliable, resulting in errors of the calculated overlay error DPTO(x,y).

BRIEF SUMMARY OF THE INVENTION

It is desirable to improve the reliability of the calculated double patterning overlay error on a substrate having test structures.

According to an aspect of the invention, there is provided a method of measuring overlay between a first structure and a second structure on a substrate. The first structure includes a first plurality of equidistant elements and the second structure includes a second plurality of equidistant elements. The first plurality of equidistant elements alternate with the second plurality of equidistant elements, and wherein a design width $CD_1$ of the first plurality of equidistant elements is different from a design width $CD_2$ of the second plurality of equidistant elements. The method includes receiving a plurality of points of interest $(x_i, y_i)$ to be investigated on the substrate. An overlay error DPTO is determined between the first structure and the second structure for each point of interest $(x_i, y_i)$. For each point of interest $(x_i, y_i)$ there is measured a width $W_1$ of a first element and a width $W_2$ of a second element. For each point of interest $(x_i, y_i)$ a difference is determined between the measured width $W_1$ of the first element and the width $W_2$ of the second element. A distribution is determined of the number of points of interest having approximately the same value for the difference as a function of the difference. If the distribution has a sub-distribution around a value $W_1$-$W_2$ having an opposite sign as compared to the difference $CD_1$-$CD_2$, points of interest are identified that are associated with the subdistribution as having incorrectly measured overlay errors.

According to an aspect of the invention, there is provided a method of manufacturing an overlay measurement structure on a substrate. The method includes forming a first structure on the substrate using a first exposure of a first patterning device, the first structure having a first plurality of equidistant elements. A second structure is formed on the substrate using a first exposure of a second patterning device. The second structure has a second plurality of equidistant elements. The first plurality of equidistant elements alternate with the second plurality of equidistant elements, and a design width of the first plurality of equidistant elements is different from a design width of the second plurality of equidistant elements.

According to an aspect of the invention, there is provided an overlay measurement structure manufactured according to the method as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
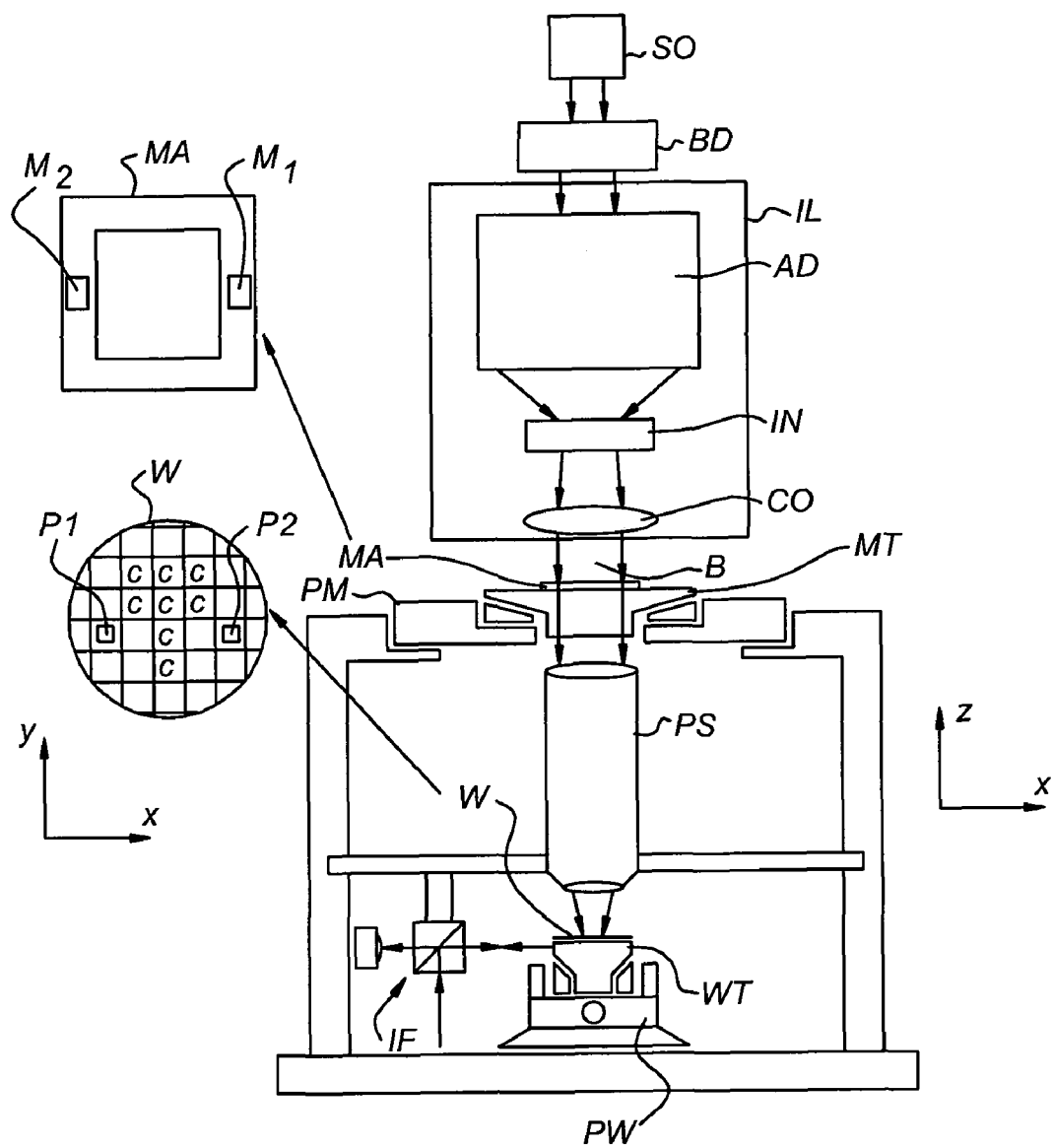
FIG. 1 depicts a lithographic apparatus which can be used to carry out the manufacturing method according to an aspect of the invention.

FIG. 1 schematically depicts a lithographic apparatus which can be used to carry out the manufacturing method according to an aspect of the invention. The apparatus includes an illumination system (illuminator) IL configured to condition a radiation beam B (e.g. UV radiation). A support structure (e.g. a mask table) MT is constructed and arranged to support a patterning device (e.g. a mask) MA and is connected to a first positioner PM configured to accurately position the patterning device in accordance with certain parameters. A substrate table (e.g. a wafer table) WT is constructed and arranged to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. The pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
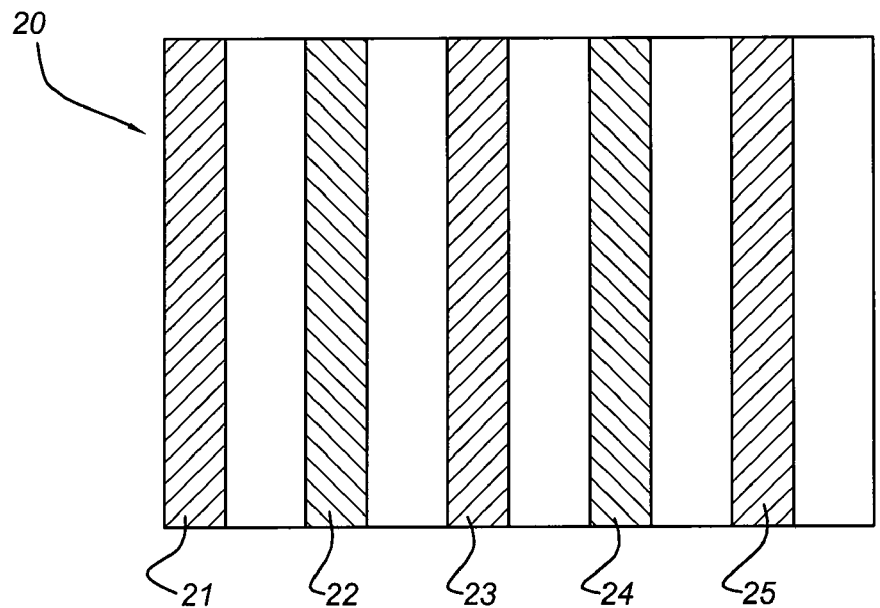
FIG. 2 schematically shows an image of a part of a CDU wafer according to the state of the art.

FIG. 2 schematically shows an image 20 of a part of a CDU wafer according to the state of the art. This image could have been made using a SEM or any other suitable imaging apparatus. The image 20 comprises a plurality of lines 21, 23, 25 of a first structure produced during a first exposure and a plurality of lines 22, 24 of a second structure produced during a second exposure. In order to calculate the local DPTO, i.e. the DPTO at the point $(x_i, y_i)$ around which the image of FIG. 2 is made, the image is processed by an image processor. The image processor needs to distinguish structure 1 from structure 2. Due to inaccuracies of the SEM, it can be difficult to distinguish structure 1 from structure 2.

Therefore, according to an embodiment of the invention, a substrate is used for calculating the DPTO which comprises a first structure and a second structure, wherein the first structure comprises a first plurality of equidistant elements and the second structure comprises a second plurality of equidistant elements, wherein the first plurality of equidistant elements alternate with the second plurality of equidistant elements, and wherein a design width $CD_1$ of the first plurality of equidistant elements is different from a design width $CD_2$ of the second plurality of equidistant elements. An example structures is shown in FIG. 3.

Figure 3:
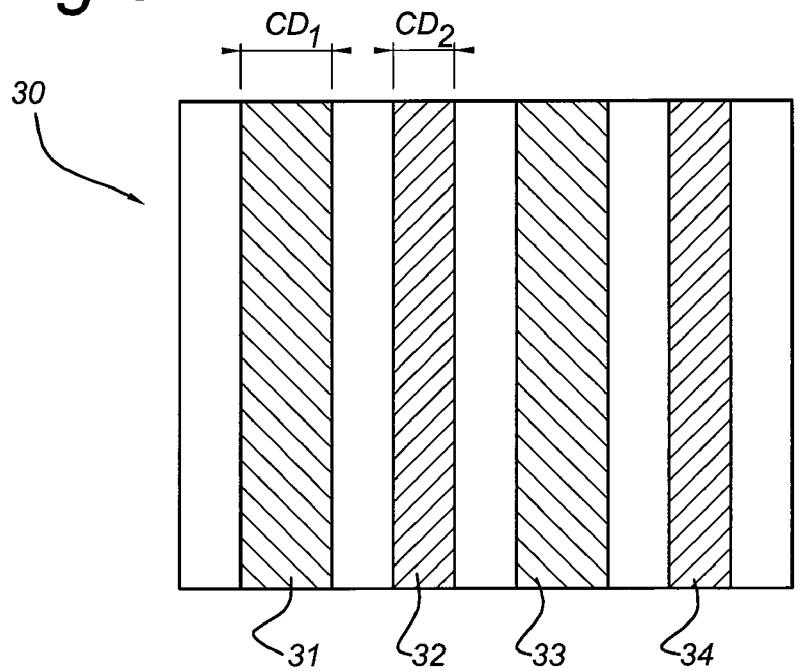
FIG. 3 shows an example of a configuration of structures according to an embodiment of the invention.

FIG. 3 shows an image 30 having parallel lines 31, 33 produced by way of a first exposure, and parallel lines 32, 34 produced by way of a second exposure. The width CD1 of the lines 31, 33 is unequal to the width CD2 of the lines 32, 34. In this case the width CD1 is larger than the width CD2. Typical values for CD1 are between 40-70 nm and typical values for CD2 are between 20-50 nm.

Figure 4:
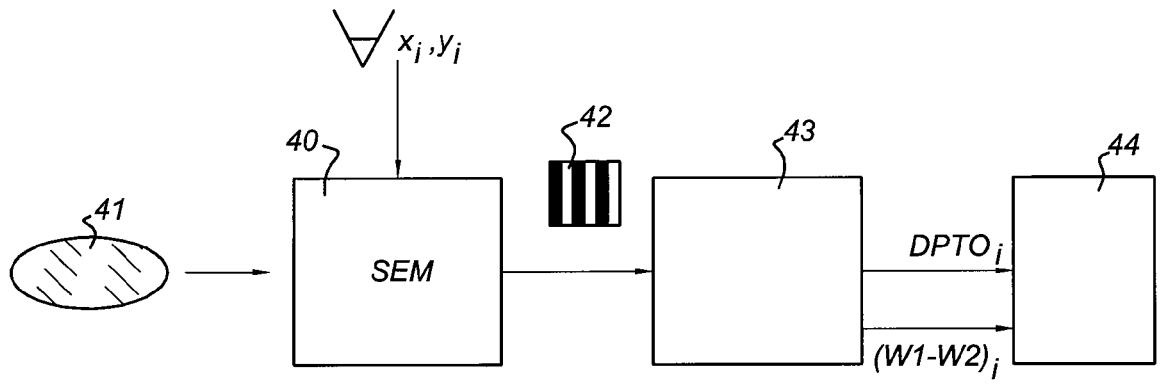
FIG. 4 diagrammatically shows part of system arranged to measure overlay errors on a substrate.

FIG. 4 diagrammatically shows a SEM 40 that is arranged to scan predefined parts of a CDU substrate 41. The SEM 40 receives data representing points (x,y) to be investigated on the CDU substrate 41. The SEM 40 produces images 42 of for example areas around each of the points $(x_i, y_i)$ to be investigated in which the point (x,y) are in the centre of the images. It should be clear to the skilled person that the SEM 40 may be arranged to produce images that are determined by the points (x,y) in any other way. An image Ii could for example be made of a rectangular area a corner of which is the point $(x_i, y_i)$. The images 42 are input for a image processor 43 which is arranged to calculate the DPTO(x,y) for each point $(x_i, y_i)$ to be investigated. This DPTO(x,y) is input for a data processor 44.

It is noted that instead of using a SEM, another metrology tool could be used, such as a scatterometer, to measure areas determined by the points $(x_i, y_i)$, as will be clear to the skilled person.

Figure 5:
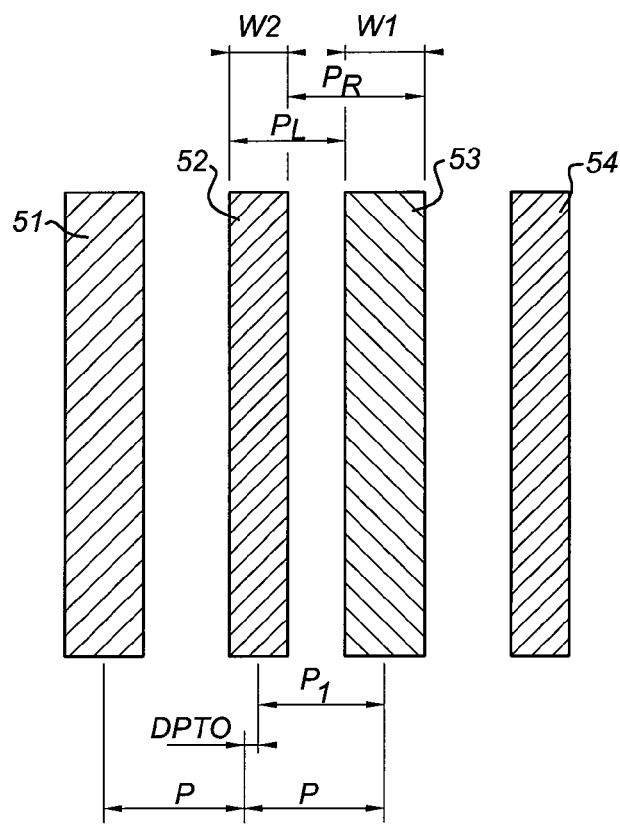
FIG. 5 schematically shows part of two structures having an overlay error.

In FIG. 5, an example is given of how the image processor 43 can determine a DPTO using a specific image. FIG. 5 shows only the relevant lines of the image. A first structure comprises lines 51, 53 the width of which is larger than the width of lines 52, 54 of a second structure. In FIG. 5, the distance between the left side of the line 53 and the left side of the line 52 is referred to as $P_L$. The distance between the right side of the line 53 and the right side of the line 52 is referred to as PR. Furthermore, a pitch P is depicted being half the distance between the centre of the first structure lines 51, 53. Typical values for the design pitch P on a CDU substrate are around 64 nm. A difference $P_1$ between the centre of line 52 and the centre of line 53 is referred to as $P_1$. This $P_1$ pitch can be calculated as follows:

$$P_1 = (P_L - P_R)/2 \tag{1}$$

Now the DPTO can be calculated as follows:

$$DPTO = P - P_1 \tag{2}$$

The DPTO is calculated at a plurality of measurement points on the CDU substrate so that a (non)uniformity of the overlay error can be determined. So for each point $(x_i, y_i)$ a value $DPTO(x_i, y_i)$ is determined. According to an embodiment, for each measurement point $(x_i, y_i)$ a width $W_1$ of the first structure line 53 is measured and also a width $W_2$ of the second structure line 52, see FIG. 5. A difference between W1 and W2 for each measurement point passed to the data processor 44. The data processor is arranged to determined a distribution shown in FIG. 6.

Figure 6:
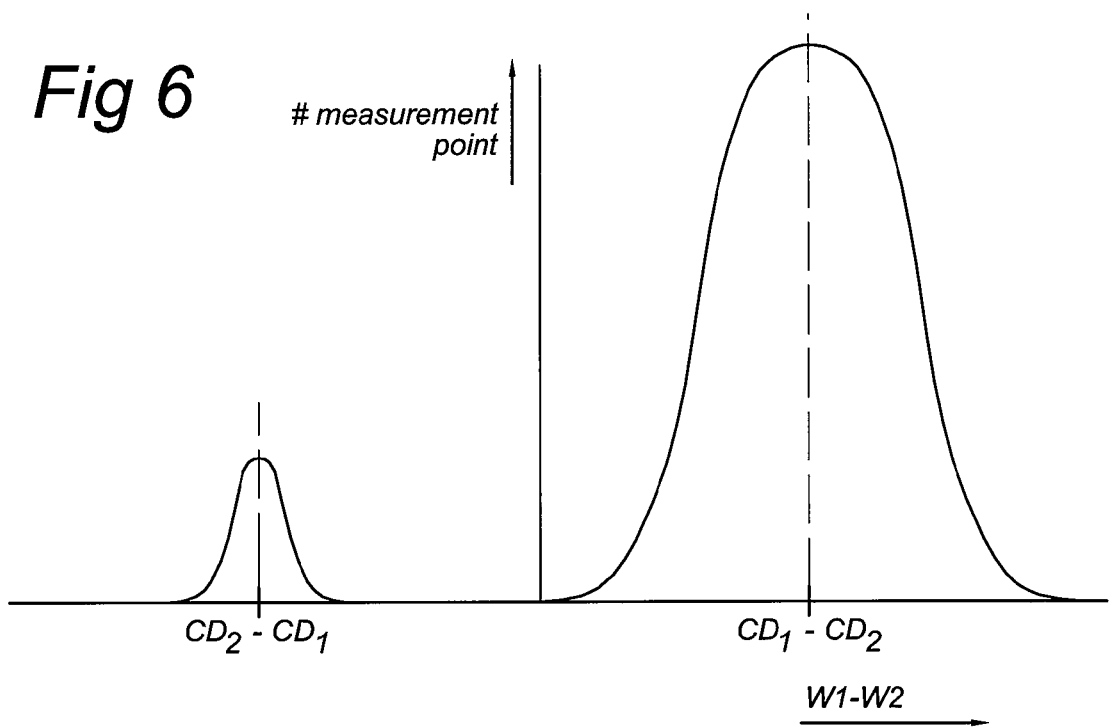
FIG. 6 is a graph showing a distribution of measurement point as a function of the difference in width of the elements of the two structures.

In FIG. 6, the number of measurement points having a value approximately equal to $W_1 - W_2$ is shown as a function of $W_1 - W_2$. As can be seen from FIG. 6, a relative large distribution of measurement points is present around the design values $CD_1 - CD_2$ resulting from the fact that actually the graph of FIG. 6 is a probability function around an expected value $CD_1 - CD_2$ with variations due to inaccuracies of the manufacturing of the lines and the inaccuracies of measuring the widths of the lines. However, as can be seen in FIG. 6, at the left side of there is also a second (smaller) distribution. This distribution (also referred to as subdistribution) has arisen around a value $CD_2 - CD_1$ which has an opposite sign of the value $CD_1 - CD_2$. The second subdistribution is the result of an incorrect identification of the lines by the image processor 43. This incorrect identification may be resulting from an inaccurate positioning of the substrate in the SEM so that the image processor, when looking for the line 53 of the first structure, actually finds a line 54, see FIG. 5 belonging to the second structure having a smaller width. This will result in an incorrect $DPTO(x_i, y_i)$. In fact, the incorrect $DPTO(x_i, y_i)$ may be corrected by switching the sign of the incorrect DPTO error of the measurement point in the smaller distribution of FIG. 6 resulting in the correct DPTO error.

Please note that the two sub-distributions of FIG. 6 may have arbitrary relative dimensions. Both distributions may be substantially equal in height and even the left subdistribution (representing the incorrect measurement points) can be larger than the right distribution. In the extreme case, the left distribution can be the only distribution present. In the latter case, the DPTO is incorrectly measured in all points. Of course, also the right distribution can be the only one present resulting from the fact that all DPTO errors are measured correctly.

Figure 7:
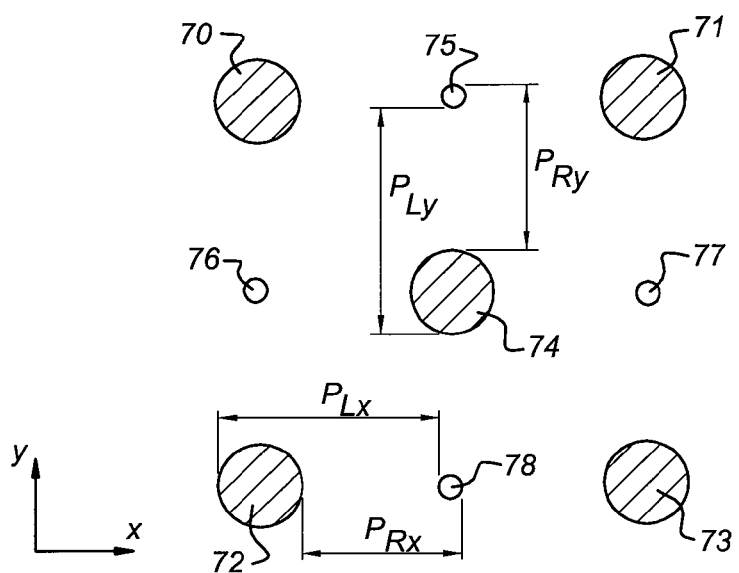
FIG. 7 shows an example of a configuration of structures according to an embodiment of the invention.

Although the structures discussed thus far in the embodiments consist of lines, the two structures manufactured on the substrate may have different configurations. An example of another embodiment is shown in FIG. 7. There, another possible configuration of the two structures is shown wherein the relatively large circular elements 70, 71, 72, 73, 74 alternate with relatively small circular elements 75, 76, 77. An advantage of this configuration is that it can be used to determine a overlay error in two directions, such as an X-direction and a Y-direction. In FIG. 7, the relevant parameters are indicated which can be input for the following formula's in order to produce the $DPTO_X$ and the $DPTO_Y$:

$$DPTO_X = P_X - (P_{Lx} + P_{Rx})/2, \text{ with } P_X \text{ the design pitch in the X-direction}$$

$$DPTO_Y = P_Y - (P_{Ly} + P_{Ry})/2, \text{ with } P_Y \text{ the design pitch in the Y-direction.}$$

Similar to the method described above with reference to FIG. 5 and FIG. 6, an error due to the SEM inaccuracies can be corrected for. In this case, two distributions for each image (i.e. measurement point) need to be calculated.

The elements of the structures (e.g. the lines) can be manufactured as holes in a top layer of the substrate. Alternatively, they can be manufactured as elevations on a top layer, or the elements of the first structure could be holes and the elements of the second structure could be elevations. Other configurations are possible as will be appreciated by the skilled person.

The different widths $CD_1$ and $CD_2$ of the structures on the substrate can be achieved using two masks $MA_1$ and $MA_2$ wherein a first mask $MA_1$ comprises elements, such as lines, having a width $CD_1$ and a second mask $MA_2$ comprises elements having a width $CD_2$. Alternatively, only one mask MA may be used that comprises only the first structure, such as the parallel lines 31, 33 of FIG. 3, and that this mask MA is exposed twice using a different dose and a different alignment. In that case, only one mask is needed to manufacture the two structures.

The method of measuring overlay as described above can be used as a qualification test. In this case, the substrate may be a CDU wafer comprising structures having alternating elements in which the structures are the main feature on the reticle. Alternatively, the structures may be test features on a product wafer. In that case the structure could be manufactured in the scribe-lines on the substrate.

Measuring overlay on double patterning wafers, may be performed on resolution of the lithographic apparatus. So, in an embodiment, the width of the first plurality of equidistant elements is less than 50 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring overlay between a first structure and a second structure on a substrate, said first structure comprising a first plurality of equidistant elements and said second structure comprising a second plurality of equidistant elements, wherein said first plurality of equidistant elements alternate with said second plurality of equidistant elements, and wherein a design width $CD_1$ of said first plurality of equidistant elements is different from a design width $CD_2$ of said second plurality of equidistant elements, said method comprising:

receiving a plurality of points of interest $(x_i, y_i)$ to be investigated on said substrate;

determining a double patterning overlay error (DPTO error) between said first structure and said second structure for each point of interest $(x_i, y_i)$;

measuring, using a metrology tool or scanning electron microscope (SEM), for each point of interest $(x_i, y_i)$ a width $W_1$ of a first element and a width $W_2$ of a second element;

determining for each point of interest $(x_i, y_i)$ a difference between said measured width $W_1$ of said first element and said width $W_2$ of said second element;

determining a distribution of the number of points of interest having approximately the same value for said difference as a function of said difference; and identifying points of interest associated with a sub-distribution as having incorrectly measured overlay errors when said distribution comprises said sub-distribution around a value $W_1-W_2$ having an opposite sign as compared to the difference $CD_1-CD_2$.

2. The method of measuring overlay according to claim 1, further comprising:

switching signs of said incorrectly measured overlay errors to render correct overlay errors.

3. The method of measuring overlay according to claim 1, wherein said DPTO error is determined by:

determining a distance $P_L$ between a first edge of said first element and a corresponding first edge of said second element positioned next to said first element in a first predefined direction;

determining a distance $P_R$ between a second edge of said first element and a corresponding second edge of said second element, said second edge being situated opposite said first edge and said corresponding second edge being situated opposite said corresponding first edge; and calculating said DPTO error for each point of interest $(x_i, y_i)$ using formula:

$$\text{DPTO} = P - (P_L + P_R)/2, \text{ with P being a design pitch.}$$

4. The method of measuring overlay according to claim 2, wherein said DPTO error is determined by:

determining a distance $P_L$ between a first edge of said first element and a corresponding first edge of said second element positioned next to said first element in a first predefined direction;

determining a distance $P_R$ between a second edge of said first element and a corresponding second edge of said second element, said second edge being situated opposite said first edge and said corresponding second edge being situated opposite said corresponding first edge; and calculating said DPTO error for each point of interest $(x_i, y_i)$ using formula:

$$\text{DPTO} = P - (P_L + P_R)/2, \text{ with P being a design pitch.}$$

5. The method of measuring overlay according to claim 1, wherein said first element is localized as being an element present at or closest to said point of interest $(x_i, y_i)$.

6. The method of measuring overlay according to claim 1, wherein said DPTO error for said plurality of points of interest $(x_i, y_i)$ is determined by means of making an image $I_i$ of an area determined by each of said plurality of points of interest $(x_i, y_i)$ using a Scanning Electron Microscope.

7. The method of measuring overlay according to claim 1, wherein said first plurality of equidistant elements comprises a first plurality of parallel lines, and wherein said second plurality of equidistant elements comprises a second plurality of parallel lines.

8. The method of measuring overlay according to claim 1, wherein said first plurality of equidistant elements comprises a first plurality of substantially circular elements, and wherein said second plurality of equidistant elements comprises a second plurality of substantially circular elements.

9. The method of measuring overlay according to claim 1, wherein said width of said first plurality of equidistant elements is less than 50 nm.

* * * * *